United States Patent
Woo et al.

(10) Patent No.: US 6,373,768 B2
(45) Date of Patent: *Apr. 16, 2002

(54) APPARATUS AND METHOD FOR THERMAL REGULATION IN MEMORY SUBSYSTEMS

(75) Inventors: Steven C. Woo, Saratoga; Ramprasad Satagopan, San Jose; Richard M. Barth, Palo Alto; Ely K. Tsern, Los Altos; Craig E. Hampel, San Jose, all of CA (US)

(73) Assignee: Rambus Inc, Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/401,988

(22) Filed: Sep. 23, 1999

Related U.S. Application Data

(63) Continuation-in-part of application No. 09/118,696, filed on Jul. 16, 1998, now Pat. No. 6,021,076.

(51) Int. Cl.[7] .................................................. G11C 7/04
(52) U.S. Cl. .................... 365/211; 365/212; 365/63; 365/52
(58) Field of Search ................................. 365/211, 212, 365/203; 327/512, 513, 52, 63

(56) References Cited

U.S. PATENT DOCUMENTS

| | | | | |
|---|---|---|---|---|
| 4,398,248 A | * | 8/1983 | Hsia et al. ............. | 365/230.03 |
| 4,716,551 A | | 12/1987 | Inagaki ..................... | 365/222 |
| 4,870,503 A | * | 9/1989 | Miura ........................ | 358/256 |
| 4,943,960 A | * | 7/1990 | Komatsu et al. ........... | 365/222 |
| 5,278,796 A | | 1/1994 | Tillinghast et al. ........ | 365/211 |
| 5,285,418 A | | 2/1994 | Yamaguchi ................. | 365/201 |
| 5,373,227 A | | 12/1994 | Keeth ......................... | 323/313 |
| 5,392,236 A | | 2/1995 | Hashimoto .................. | 365/185 |
| 5,440,520 A | | 8/1995 | Schutz et al. .............. | 365/226 |
| 5,446,696 A | | 8/1995 | Ware et al. ................. | 365/222 |
| 5,451,892 A | | 9/1995 | Bailey ........................ | 327/113 |
| 5,598,395 A | | 1/1997 | Watanabe ................... | 369/116 |
| 5,692,202 A | | 11/1997 | Kardach et al. | |
| 5,805,517 A | | 9/1998 | Pon ............................ | 365/212 |
| 5,875,142 A | * | 2/1999 | Chevallier .................. | 365/212 |
| 6,002,627 A | * | 12/1999 | Chevallier .................. | 365/212 |
| 6,021,076 A | * | 2/2000 | Woo et al. .................. | 365/211 |

FOREIGN PATENT DOCUMENTS

| | | |
|---|---|---|
| DE | 196 35 225 A | 3/1998 |
| EP | 0 851 427 A2 | 7/1998 |
| GB | 2 239 539 A | 7/1991 |
| WO | WO 92/10032 | 6/1992 |
| WO | WO 93/06549 A | 4/1993 |
| WO | WO 93/12480 A | 6/1993 |
| WO | WO 96/36925 A | 11/1996 |

OTHER PUBLICATIONS

Copy of Partial International Search Report in related case PCT/US 99/16063 citing documents BA, BB, and AL herein.
International Search Report in related case PCT/US 99/16063.

* cited by examiner

*Primary Examiner*—David Nelms
*Assistant Examiner*—Gene N. Auduong

(57) ABSTRACT

A memory system configured to provide thermal regulation of a plurality of memory devices is disclosed. The memory system comprises a memory module having a plurality of memory devices coupled to a bus. Additionally, the memory system also comprises a controller coupled to the bus. The controller determines an operating temperature (actual or estimated) of the memory device. Based on the determined operating temperature of the memory device, the controller is further operable to manipulate the operation of the memory system.

30 Claims, 11 Drawing Sheets

APPARATUS AND METHOD FOR THERMAL REGULATION IN MEMORY SUBSYSTEMS

CROSS REFERENCE TO RELATED APPLICATION(S)

This application is a continuation-in-part of Ser. No. 09/118,696 filed Jul. 16, 1998, now U.S. Pat. No. 6,021,076.

FIELD OF THE INVENTION

The present invention relates to thermal regulation of memory devices in a memory system. More particularly, the present invention relates to an apparatus and method used to control operation of a memory system to regulate the operating temperature of memory devices in the memory system.

BACKGROUND OF THE INVENTION

Improvements in microprocessor designs have led to microprocessors with a high operating frequency. Current microprocessor designs have operating frequencies of 400 megahertz ("MHz") and higher. The increase in operating frequency, however, has not led to fully acceptable performance gains. One of the main factors adversely affecting performance gains is created when the microprocessor idles during delays in external memory access. The delays in external memory access are caused by the conventional design characteristics of static random access memory ("SRAM") cells, read only memory ("ROM") cells, and dynamic random access memory ("DRAM") cells.

To counteract the performance losses associated with external memory access, Rambus Inc., of Mountain View, Calif., developed a high speed memory system. FIG. 1 illustrates the Rambus high speed memory system. In particular, system 100 shows a master device, memory controller ("MC") 10, coupled to memory devices DRAM 20, SRAM 30, and ROM 40. Each device is coupled in parallel to signal lines DATA BUS, ADDR BUS, CLOCK, $V_{REF}$, GND, and VDD. DATA BUS and ADDR BUS show the data and address lines used by MC 10 to access data from the memory devices. CLOCK, $V_{REF}$, GND, and VDD are the clock, voltage reference, ground, and power signals shared between the multiple devices. Data is transferred by memory device bus drivers (not shown) driving signals onto the bus. The signals are transmitted over the bus to a destination device, such as MC 10 or a central processing unit ("CPU") (not shown). Accordingly, MC 10 coordinates the data transfer between the memory devices of system 100 and a destination device.

To increase the memory access speed, system 100 supports large data block transfers between the input/output ("I/O") pins of the destination device and the memory devices of system 100. System 100 may also include design requirements that constrain the length of the transmission bus, the pitch between the bus lines, and the capacitive loading on the bus lines. Using these design requirements system 100 operates at a higher frequency than conventional memory systems. Accordingly, by increasing operating frequency the performance of system 100 increases, thus reducing the idle time of the destination device coupled to system 100.

Although a high operating frequency increases data throughput, operating system 100 at a high frequency typically results in higher power dissipation and correspondingly higher system temperatures. This result is not unexpected when the basic concept of thermal capacities is considered. The heat curve shown in FIG. 2 illustrates this concept.

Beginning at some ambient temperature (T, ambient), the temperature of an electrical device will rise over time to a maximum, steady state temperature (T, steady state) as constant power is applied. The rate at which the temperature rises is determined by the thermal capacity of the device. The steady state temperature is defined by many factors including the geometry, size, composition, and surrounding environment (such as air flow) of the device.

In the particular case of memory devices in a memory system, power is not constant. Rather, the memory device is switched ON and OFF with individual data requests. Thus, the heating curve for a memory device will fluctuate considerably depending on it use in addition to its thermal capacity.

Excessive heating of a memory device may cause problems well below the steady state temperature. In fact, memory devices are designed to operate at temperatures below a given junction temperature ("$Tj_{max}$")

Additionally, provided the memory device includes a dynamic cell design, its specification will also include a defined periodic refresh rate. The refresh rate ensures that the storage cells of the dynamic device are periodically recharged. Increasing the operating frequency of a memory system, however, results in the memory devices of the memory system generating high power levels. The high power levels translate into an increase in the operating temperature of the memory devices. If the operating temperature of a memory device surpasses $Tj_{max}$ the memory device may fail, thus resulting in the failure of the memory system.

To ensure lower operating temperatures, prior art memory systems implement conventional thermal management techniques. In particular, to reduce the operating temperature of a memory device, prior art memory systems typically use specific packaging designs and specify the location of memory devices in memory systems. Conventional thermal management techniques, however, create numerous disadvantages.

In fact, many of the conventional thermal management techniques are not readily applicable to evolving high frequency memory systems. Conventional thermal management using packaging designs for the memory devices is a good example. In particular, conventional packaging designs are not always effective for dissipating heat generated by memory devices operating at frequencies in excess of 100 Mhz. Accordingly, the application of traditional packaging designs to reduce thermal dissipation prove ineffective in the thermal regulation of system 100.

Conventional thermal management techniques based on the design layout of memory systems is another good example. In particular, such conventional thermal management techniques require large spacings between components to reduce heat transfer. In system 100, however, the devices are located in relatively close proximity to one another in order to increase data throughput. Accordingly, the application of conventional placement techniques to reduce thermal dissipation prove ineffective in the thermal regulation of system 100.

SUMMARY OF THE INVENTION

In view of the foregoing, a brief summary of some exemplary embodiments will now be presented. Some simplifications and omissions may be made in this summary, which is intended to highlight and introduce some aspects of the present invention, but not to limit its scope in any way. Detailed descriptions of the preferred embodiments adequate to allow those of ordinary skill in the art to make and use the inventive concepts are provided hereafter.

The present invention provides a system and method for thermal regulation of a memory system. Memory systems operating at high frequencies are particularly well adapted to the present invention. That is, despite the fact that high frequency operation results in greater power dissipation and increased heat, the present invention yet allows the memory devices in the system to operate below a specified junction temperature, or in the alternative to reliably operate at temperatures above the specified junction temperature with appropriate modification of the system's performance parameters.

In one embodiment of the present invention, the operating temperature of the memory device(s) is estimated. In another embodiment, the actual operating temperature of the memory devices(s) is measured. In either embodiment, operating temperature may be derived on a memory device by memory device basis, or on a memory module basis.

For example, one aspect the present invention provides a memory system comprising a memory controller coupled to a bus, and at least one memory device coupled to the bus. Typically there are a plurality N of memory devices coupled to the bus. The memory controller comprises a tracking circuit operable to track a number of memory device operations involving M of the N memory devices during a period of time, where M is less than or equal to N. The memory controller also comprises a control circuit operable to manipulate operation of the memory system in response to a comparison of the number of memory operations and a reference.

The tracking circuit preferably comprises at least one counter, and more preferably a first counter incremented by each read operation during the period of time, and a second counter incremented by each write operation during the period of time. The at least one counter may comprise a First-In-First-Out (FIFO) buffer.

The comparison reference comprises power value data relating a number of memory device operations with an estimated operating temperature for the at least one memory device. Power value data may be stored in the memory controller, in one or more register associated with the at least one memory device, or in a data storage element associated with a memory module. The comparison might, however, be made directly to a counter value in the tracking circuit which maps to a true, known power value.

In another aspect, the present invention provides a memory system comprising a memory controller coupled to a bus, a memory device coupled to the bus and having a maximum operating temperature, a temperature sensor measuring an operating temperature associated with the memory device(s). The temperature sensor may be associated with the memory device(s) proper, a thermocouple attached to the memory device(s), or the heat spreader itself.

However the operating temperature of the memory device is derived, actually measured or estimated, it is used as a reference in relation to one or more threshold values (for example, the junction temperature noted above) to regulate operation of the memory system in order to regulate the temperature of the memory devices. Thermal regulation may be accomplished in a number of ways.

In one aspect, the memory controller further comprises a delay circuit operable to select delays between successive operations, for example a first delay between successive read operations and a second delay between successive write operations on the basis of a control circuit comparison indicating that the number of memory operations exceeds the reference.

In another aspect, the memory device(s in the memory system are operable in first and second modes of operation, wherein the memory device consumes less power in the second mode of operation as compared with the first mode of operation, and the memory controller is operable to select between the first and second modes of operation for the memory device on the basis of the control circuit comparison.

In yet another aspect, a method of regulating.the operating temperature of a memory device in a memory system is used in which a number of operations involving the memory device during a time period are determined, the number of operations is compared to reference data corresponding to an estimated operating temperature for the memory device, and the operation of the memory system is potentially manipulated on the basis of the comparison between the number of operations and the reference data.

For another embodiment, the memory system includes multiple memory devices functionally grouped on a memory module. Thermal loading is often a system characteristic more aptly attributable to a memory module, rather than individual memory devices since the memory module can contain a heat spreader across the span of grouped memory devices. Where the operating temperature is estimated, the estimation may be made in relation to memory system operations occurring in one or more memory devices on the memory module. Where the actual operating temperature is measured, measurement may take place in the memory devices proper, or at one or more thermocouples associated with the memory devices and/or the memory module heat spreader.

BRIEF DESCRIPTION OF THE DRAWINGS

The features and advantages of the present invention are illustrated by way of example and not limitation in the figures of the accompanying drawings in which like references indicate like elements, and in which.

DETAILED DESCRIPTION

Figure 1:
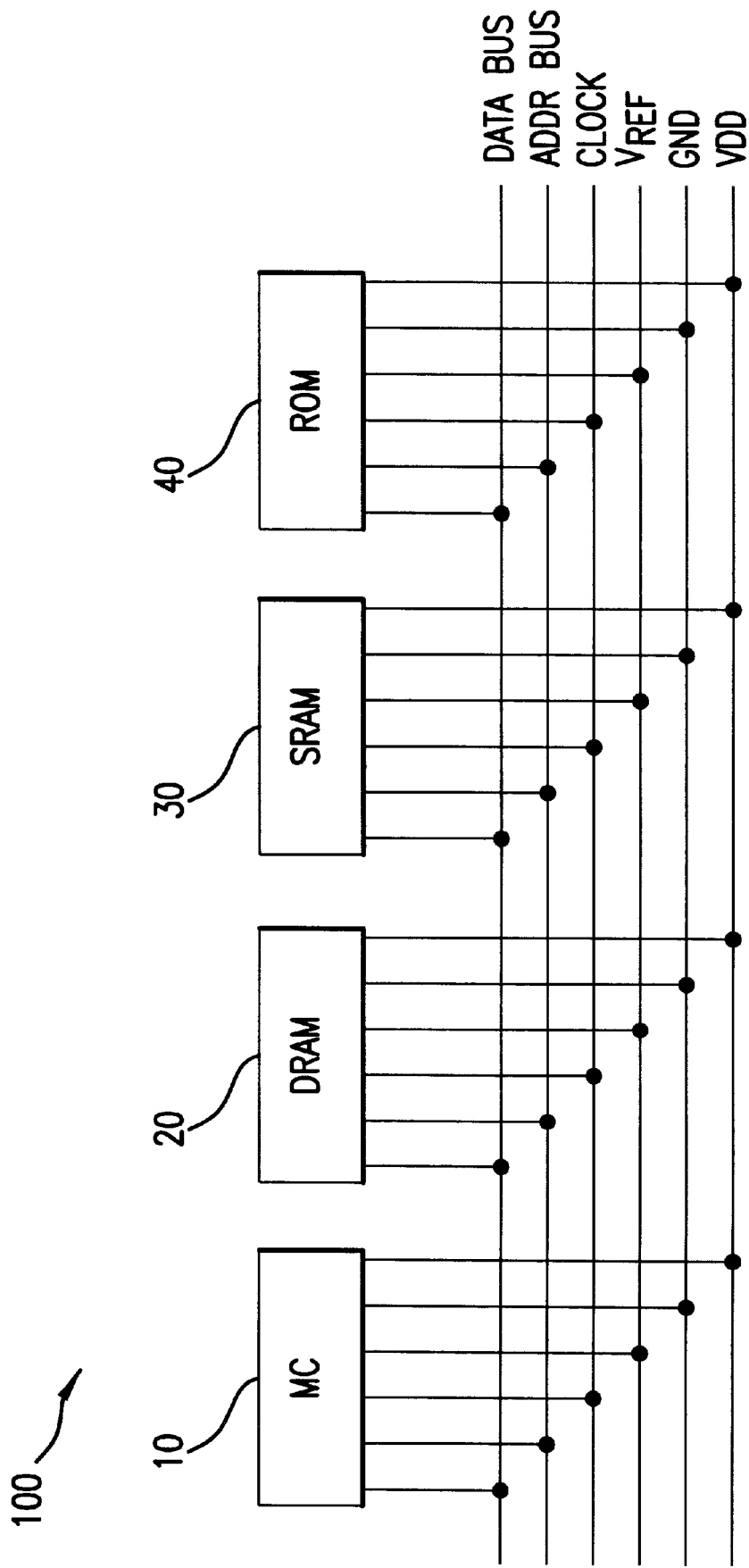
FIG. 1 illustrates a prior art memory system.
Figure 2:
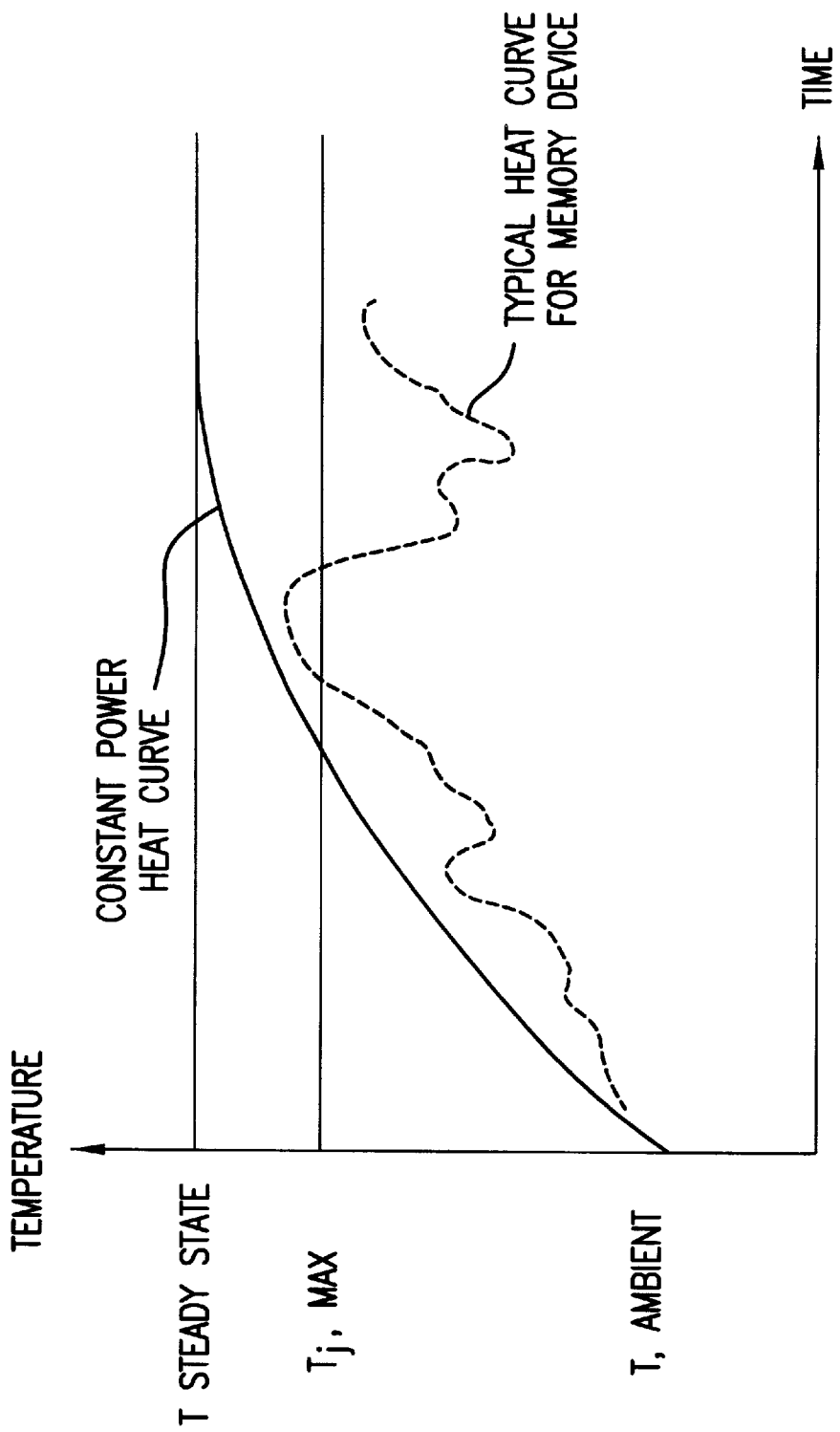
FIG. 2 is a graph illustrating the concept of thermal capacity.

A system and method for thermal regulation of a memory system is disclosed. Nominally, the memory system includes a memory controller and at least one memory device. The present invention is particularly well adapted for use in a memory system operating at relatively high frequencies. Despite the fact that high frequency operation results in greater power dissipation and increased heat, the present invention allows the memory device(s) in the system to operate below a specific junction temperature ("$Tj_{,max}$") For example, a conventional memory device, such as a dynamic random access memory ("DRAM") , might have a $Tj_{,max}$ of one hundred degrees Celsius (100° C.).

In one embodiment of the present invention, the operating temperature of the memory device(s) is estimated. In another embodiment, the actual operating temperature of the memory devices(s) is measured. In either embodiment, operating temperature may be derived on a memory device by memory device basis, on a memory module basis, or on the entire memory system. However derived, the operating temperature (actual or estimated) of the memory device(s) is used as a reference in relation to a threshold value to regulate operation of the memory system in order to regulate the temperature of the memory device(s).

Thermal regulation may be accomplished in a number of ways. For example, the present invention may ensure that the operating temperature of the memory device(s) remains below this $Tj_{,max}$ using one or more of a number of techniques. Alternatively, the present invention may allow the memory device to operate at a temperature greater than $Tj_{,max}$, but increases the refresh rate of dynamic memory device(s) in the system to ensure reliable operation at these higher temperatures.

In one embodiment, the present invention includes a circuit, preferably incorporated within the memory controller, that estimates the operating temperature of the memory device(s). To estimate the operating temperature of one or more memory devices, the circuit tracks the data transfer operations within the memory system. In particular, the circuit counts and stores the number of read/write operations, as well as the number of other relevant DRAM operations (like refresh operations), involving the memory device(s). Based on the number and types of operations in a given time period, the circuit estimates the operating temperature of the memory ID device(s). If the operating temperature of the memory device(s) exceeds a threshold value, the circuit regulates operation of the memory system.

In another embodiment, the memory device(s) include a temperature sensor coupled to the control circuit in the memory controller. The temperature sensor measures an operating temperature associated with the memory device (s). If the temperature sensor indicates that the memory device is operating above a given threshold temperature, the apparatus regulates the operation of the memory system.

The memory system may include multiple memory devices functionally grouped on a module. Thermal loading is often a memory system characteristic more aptly attributable to a memory module, rather than individual memory devices since the memory module may contain a heat spreader across the span of grouped memory devices. Where the operating temperature is estimated, the estimation may be made in relation to memory system operations occurring in one or more memory devices on the memory module. Where the actual operating temperature is measured, measurement may be taken by a special circuit within the memory devices proper, or by one or more thermocouples attached to the memory devices or the memory module heat spreader.

Regulating the operation of the memory system results in regulation of the operating temperature of the memory devices in the memory system. A number of regulation schemes are possible. For example, the regulation scheme may consist of increasing the refresh rate of the memory system, dynamically changing the timing parameters of the memory system, dynamically placing components of the memory system in a low power mode, and/or dynamically enabling a cooling system.

Effective thermal regulation allows enhanced operating performance in memory systems operating at high frequencies.

Figure 3:
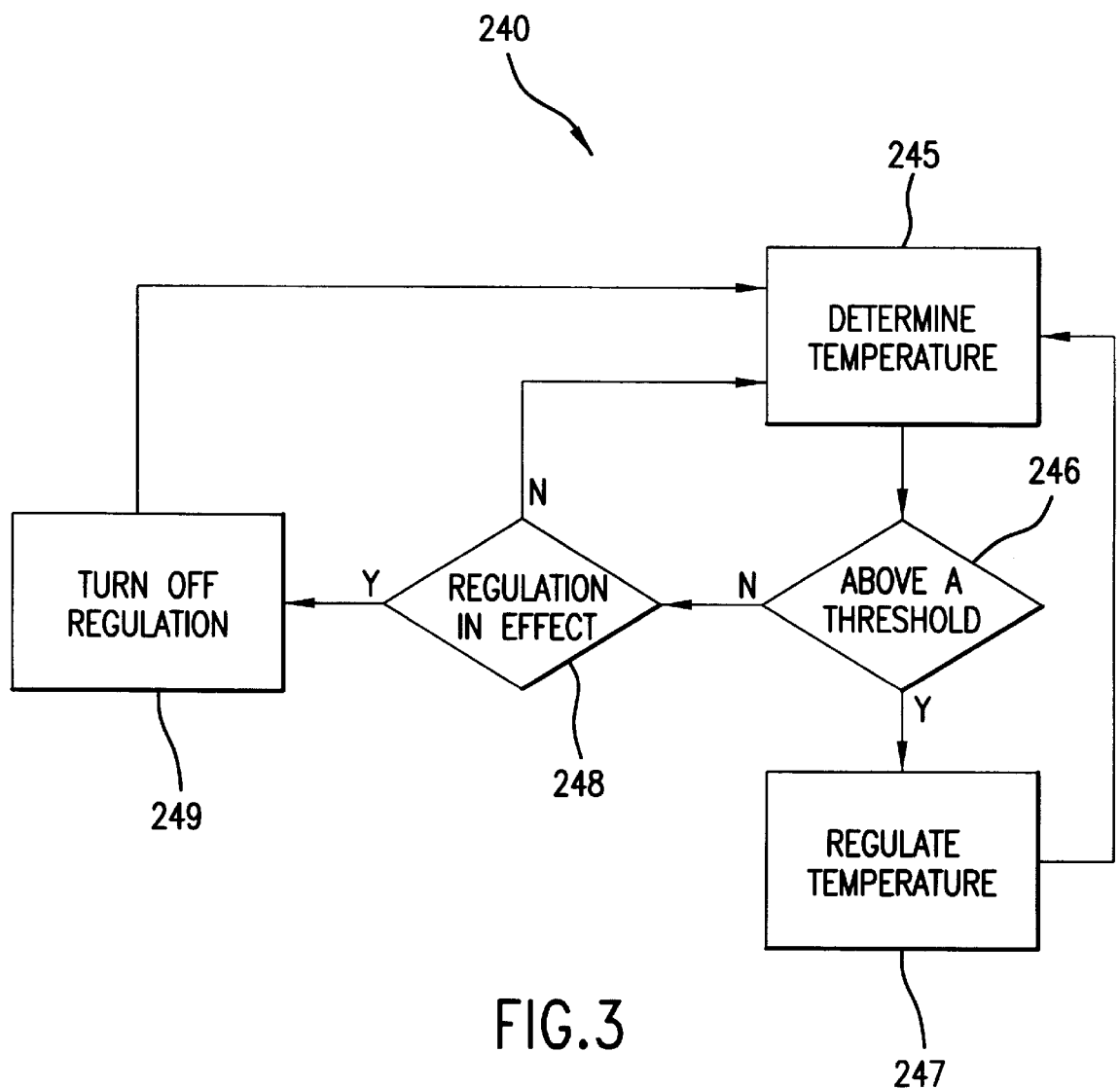
FIG. 3 is a high level flowchart illustrating a method of thermal regulation in a memory subsystem according to one embodiment of the present invention.

Turning now to the drawings, FIG. 3 is a high level flowchart illustrating one embodiment of the present invention for implementing thermal regulation in a memory system. In particular, flowchart 240 illustrates a method used to turn off or turn on an exemplary thermal regulation scheme. In step 245, a memory system determines the operating temperature of a memory device. Examples of actual methods and circuitry adapted to determine the temperature of the memory device are described below.

Step 246 follows the completion of step 245. In step 246, the operating temperature of the memory device is compared against a predetermined threshold value. If the operational temperature exceeds the threshold value, then step 247 is begun. In step 247, the memory system initiates a thermal regulation scheme. After step 247 is completed, the memory system returns to step 245. If the comparison done in step 246 finds that the operational temperature does not exceed the threshold value, however, then step 248 is begun.

In step 248, the memory system determines whether a thermal regulation scheme is active. If a thermal regulation scheme is not active, then the next step is step 245. If during step 248 the system determines that a thermal regulation scheme is active, then the memory system moves to step 249 in which the memory system turns off the regulation scheme because the memory device is operating below the threshold value. After step 249, the system returns to step 245. For one embodiment, a memory system including thermal regulation circuitry and one or more memory devices follow the steps in flowchart 240 to regulate the operating temperature of the memory devices.

Figure 4:
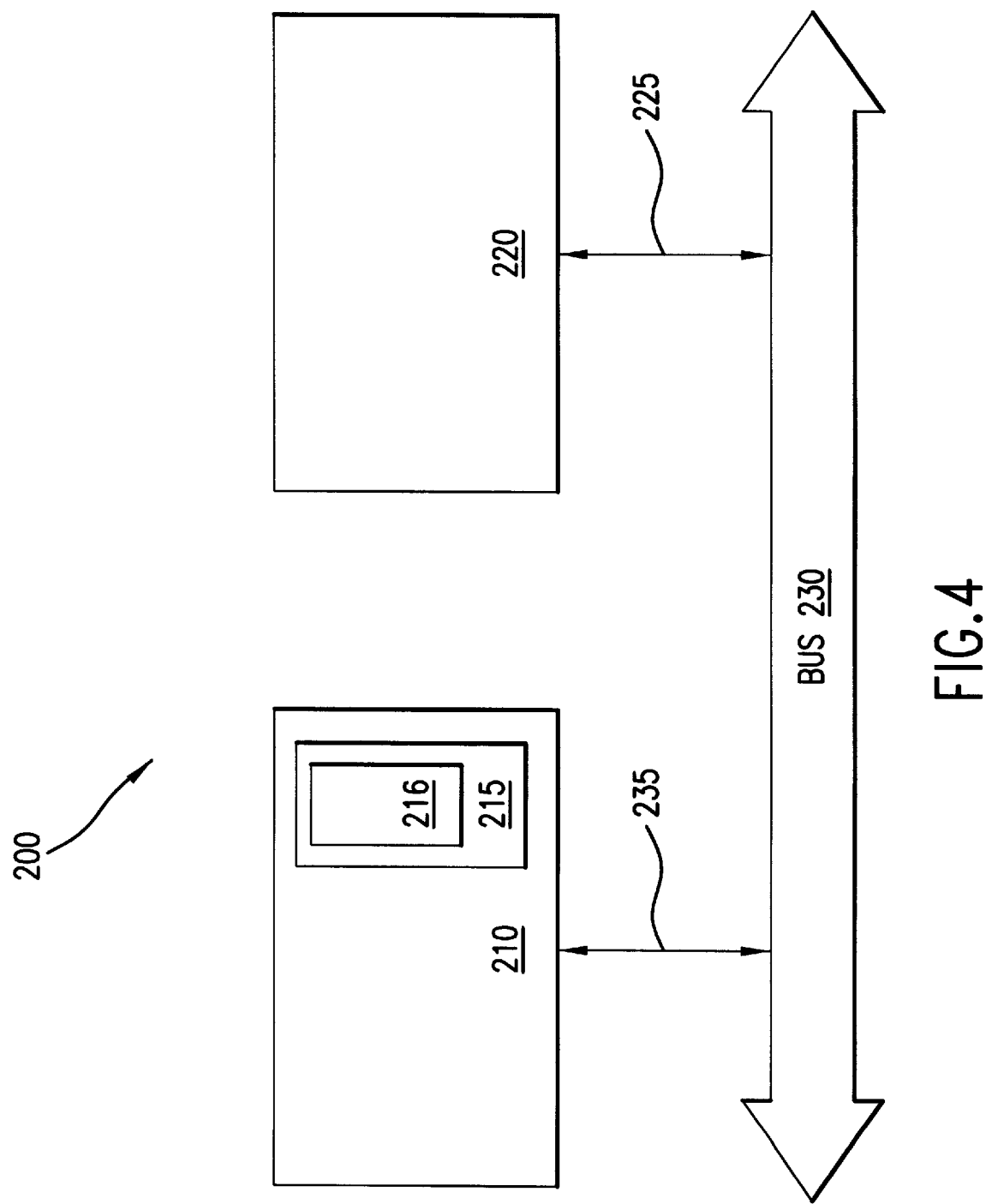
FIG. 4 shows one embodiment of the present invention in which a memory device is coupled to a memory controller having a thermal regulation circuit.

FIG. 4 shows one embodiment of a memory device coupled to a memory controller with thermal regulation circuitry. In particular, system 200 includes controller 210 coupled to bus 230 along line 235. Bus 230, in turn, is coupled to memory device 220 via line 225. For one embodiment, bus 230 transmits address and data between controller 210 and memory device 220. Accordingly, using bus 230, controller 210 reads/writes data directly from memory device 220. Using bus 230, controller 210 also transfers data from memory device 220 to a second device (not shown) coupled to bus 230.

As illustrated in FIG. 4, controller 210 also includes circuit 215 and circuit 216. Circuit 215 is used to ensure that memory device 220 does not operate at a temperature exceeding $Tj_{,max}$. For one embodiment, circuit 216 is used to track the operations of memory device 220 over a given time period. Data relating the amount of energy/heat expended by a typical memory device 220 during various memory system operations is developed empirically. This "power value data" is stored within the memory system, and later used as a reference to estimate the operating temperature of the memory device in relation to a number of memory system operations involving the memory device.

For example, circuit 215 may use the counted operations data stored in circuit 216 in conjunction with the empirically derived power value data to estimate the operational temperature of memory device 220 during the given time period. If the estimated temperature exceeds the threshold value $Tj_{max}$, a regulation scheme is used to throttle the operation of system 200, thus reducing the temperature of memory device 220.

For one embodiment, circuit 216 is a memory block used to store the number and types of operations performed by memory device 220. For an alternative embodiment, circuit 216 is a first-in first-out ("FIFO") buffer with each stage of the FIFO buffer including multiple counters.

Figure 5:
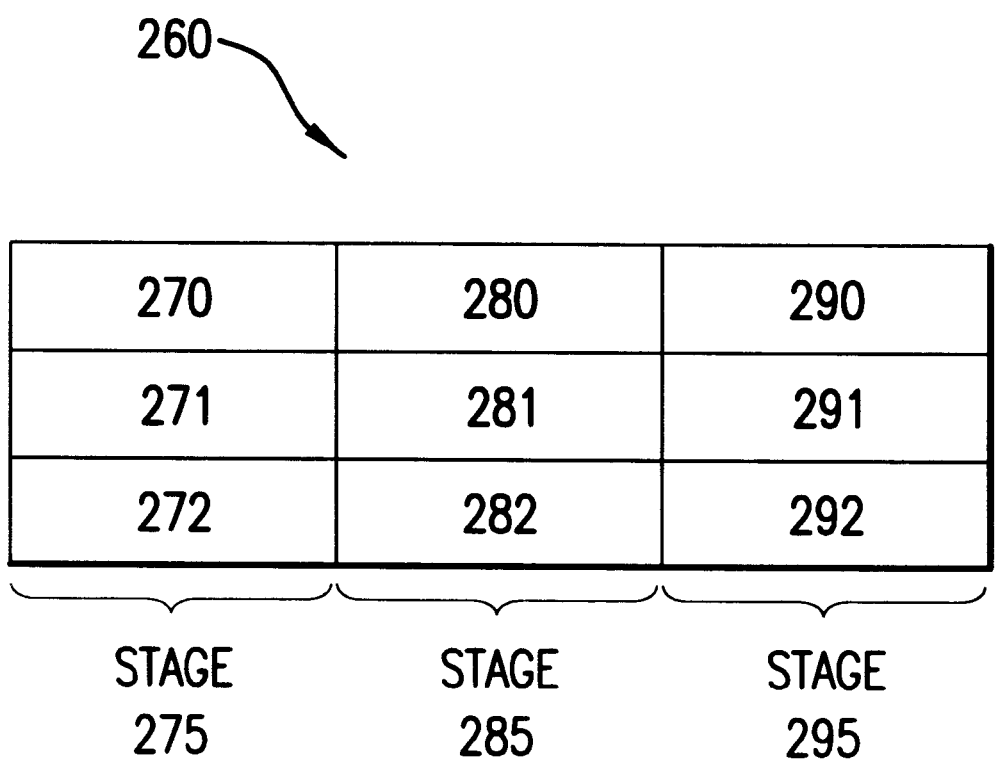
FIG. 5 illustrates a FIFO buffer having application within the embodiment shown in FIG. 4.

FIG. 5 illustrates one embodiment of the FIFO buffer. In particular, FIFO buffer 260 includes three stages (275, 285, and 295) with each stage including a set of counters. Stage 275 includes counters 270–272. Stage 285 includes counters 280–282 and stage 295 includes counters 290–292. Each set of counters tracks the number of times specific operations are performed by memory device 220 in a given time period "t1." Thus, each stage in FIFO buffer 260 denotes the number of times three specific operations are performed by memory device 220 during a "t1" time period. For example, in stage 275, counter 270 might record the number of precharge operations, counter 271 might record the number of read operations, and counter 272 might record the number of write operations occurring during period t1. The number of stages of the FIFO buffer determines the extent of time during which the operations of memory device 220 are tracked.

For example, for one embodiment, the FIFO has five stages and t1 equals 1 second. Depending on the environment, first order calculations indicate that several million operations occurring in a few seconds can equate to memory device 220 having a temperature of 95 degrees. Circuit 215 uses the five entries to calculate the activity of memory device 220 over this time period. In particular, based on the counter values of the FIFO buffer and empirically determined power value data for each type of operation, circuit 216 calculates the total power dissipated by memory device 220. The empirical power value data is used to correlate the total power to the temperature of memory device 220.

The empirically determined power value data may be stored in the memory controller, for example, as part of circuit 215. While storing the power value data in the memory controller allows ready access, such data is memory device specific. Since the memory controller manufacturer is often different from the various memory device manufacturers, obtaining and incorporating the power value data into the memory controller can prove difficult.

Alternatively, the power value data may be stored in one or more registers located directly on each memory device. This embodiment allows each memory device, class of memory devices, or batch of memory devices to accurately indicate its own specific power value data. The memory controller may read the one or more memory registers upon memory system initialization.

The power value data may be stored in registers associated with a memory module in the memory system. Those of ordinary skill in the art will recognize that a plurality of memory devices are often grouped and packaged together in module form. Many conventional memory modules include a data storage element sometimes referred to as a "Serial Presence Detect," device or SPD device. This memory element contains reference data (i.e., number, type, etc.) for the memory devices on the memory module. In one embodiment of the present invention, the SPD device or similar data storage element is used to store the power value data along with the conventional reference data.

Returning to the example illustrated in FIGS. 3, 4 and 5, if the circuit 216 calculation is below a predetermined threshold value system 200 operates normally. If the circuit 216 calculation is above a predetermined threshold value, then controller 210 selects a regulation scheme to throttle the operation of system 200, thus controlling the operational temperature of memory device 220.

In one possible alternative embodiment, memory system 200 includes multiple memory devices, and multiple circuits 215, each one governing an individual memory device, are included in controller 210. Multiple circuits 215 allow controller 210 to determine the operating temperature of each memory device and subsequently regulate the operation of memory system 200. Within this embodiment, different predetermined values may exist for different memory devices, or groups of devices. In effect, the provision of multiple different predetermined reference values establishes multiple trip points which allow system 200 to initiate one or more different regulation schemes for various trip points. Accordingly, system 200 may implement varied or graduated mechanisms to reduce the operating temperature of one or more memory devices. The graduated control approach allows system 200 to balance memory device temperature control with overall system performance.

System 200 may incorporate a variety of regulation schemes to ensure that memory device 220 operates below $Tj_{max}$. In one embodiment, to ensure that memory device 220 operates below $Tj_{max}$, system 200 can increase the timing parameters of memory device 220—i.e., change the time required for memory device 220 to perform specific operations. In an alternative embodiment, to ensure that memory device 220 operates below $Tj_{max}$, controller 210 introduces delays into the instruction sequence of memory device 220. In particular, if circuit 216 indicates a count value above a given threshold, controller 210 delays the execution of instructions directed to memory device 220. In yet another embodiment, to ensure that memory device 220 operates below $Tj_{max}$, controller 210 can change the operation mode of memory device 220 or activate a cooling system.

Figure 6:
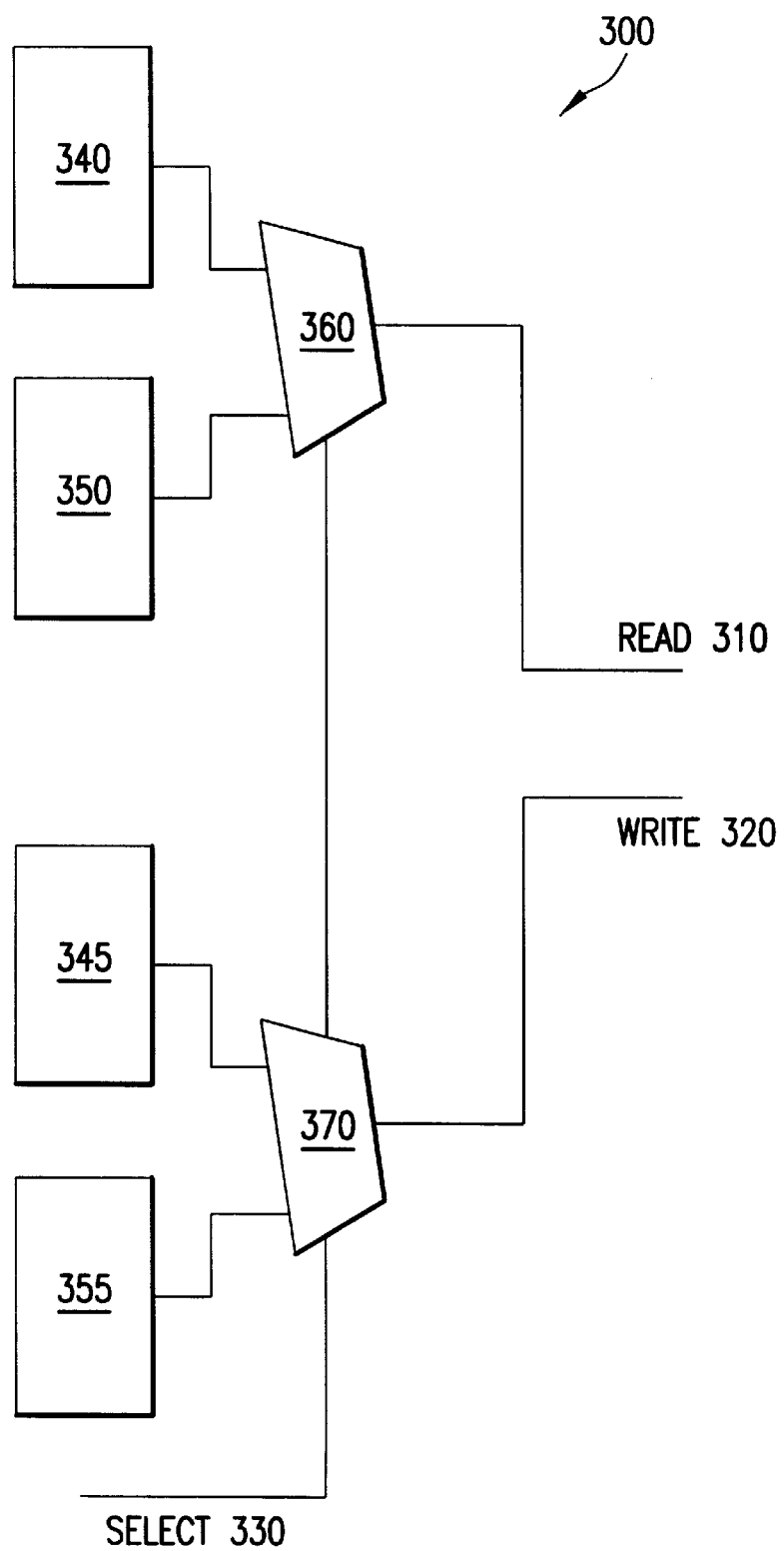
FIG. 6 shows an exemplary circuit used by a memory controller of present invention to reduce the timing parameters of a memory device.

FIG. 6 shows one embodiment of a circuit used by controller 210 to reduce the timing parameters of memory device 220. In particular, circuit 300 is coupled to circuit 215 and includes four registers (340–355), two select circuits (360 and 370), input select 330, output read 310, and output write 320. As illustrated in FIG. 6, registers 340 and 350 are coupled to select circuit 360. The output of select circuit 360 is coupled to read 310. Similarly, registers 345 and 355 are coupled to select circuit 370. The output of select circuit 370 is coupled to write 320. Both select circuits 360 and 370 are coupled to select signal 330.

For one embodiment, read 310 is used to determine the delays of controller 210 between successive reads from memory device 210. Similarly, write 320 is used to determine the delays of controller 210 between successive writes to memory device 210. In the present embodiment, during initialization of system 200, memory device 220 loads normal operation read/write delays into registers 340 and 345, respectively. Subsequently, to vary system 200 timing parameters controller 210 uses delays stored in registers 350 and 355. In particular, during normal operation controller 210 moves select signal 330 to a first position. If select 330 is in a first position, register 340 is coupled to read 310 and register 345 is coupled to write 320. As previously described, registers 340 and 345 increase delays used during normal operation. Accordingly, during normal operation outputs read 310 and write 310 generate the data stored in register 340 and 345. For example, from the initialization process register 340 holds the value four and register 345 holds the value six. Thus, during normal operation controller 210 waits four cycles between successive reads of memory device 220. Additionally, during normal operation controller 210 waits six cycles between successive writes to memory device 220.

If circuit 216 exceeds a threshold value, however, controller 210 moves select 330 to a second position. When select 330 is in a second position, register 350 is coupled to read 310 and register 355 is coupled to write 320. Registers 340 and 345 include delays used during thermal regulation. In contrast to the values stored in registers 340 and 345, registers 350 and 355 hold higher values. For one embodiment, the values stored in registers 350 and 355 are derived from empirical data. For example, based on empirical data register 340 stores the value twelve and register 345 stores the value eighteen. Accordingly, during thermal regulation controller 210 waits twelve cycles between successive reads of memory device 220. Additionally, during thermal regulation controller 210 waits eighteen cycles between successive writes to memory device 220. Regulating the timing parameter of system 200 allows controller 210 to control the operational temperature of memory device 210, thus ensuring that memory device 210 does not exceed $Tj_{,max}$.

To ensure that memory device 220 operates below $Tj_{,max}$ system 200 can also change the operation mode of memory device 220. For example, for one embodiment, memory device 220 has two operational modes. The operational modes include normal operation and low power modes. One low power mode, called a drowsy mode, reduces power dissipation by reducing performance, while another low power mode, called nap, reduces power dissipation by preventing memory access. During low power mode, system 200 consumes less power. In particular, during low power mode memory device 220 turns off non-essential circuitry. The reduction in the power consumption of memory device 220 translates to a reduction in the operating temperature of memory device 220. For one embodiment, if circuit 216 indicates a value above a given threshold, then controller 210 places memory device 220 in a low power mode.

As previously described, placing memory device 220 in a low power mode reduces the thermal dissipation of memory device. The low power modes, however, reduce the performance of system 200. In particular, during the low power modes memory device 220 disables unnecessary circuitry. For one embodiment, controller 210 places memory device 220 in a low power mode for a predetermined time.

The aforementioned regulation schemes helps to ensure that the temperature of memory device 220 does not exceed $Tj_{,max}$. For one embodiment, memory device 210 comprises a dynamic memory device. A regulation scheme that allows memory device 220 to operate above $Tj_{,max}$ is possible. In particular, if circuit 216 indicates a count value above a given threshold, then the regulation scheme requires that controller 210 increases the refresh rate of memory device 220. The increased refresh rate allows memory device 220 to store information that would typically be lost at temperatures above $Tj_{,max}$, thereby effectively increasing $Tj_{,max}$. The increased refresh rate can also reduce temperature by decreasing the time a device is available to perform new operations.

Figure 7:
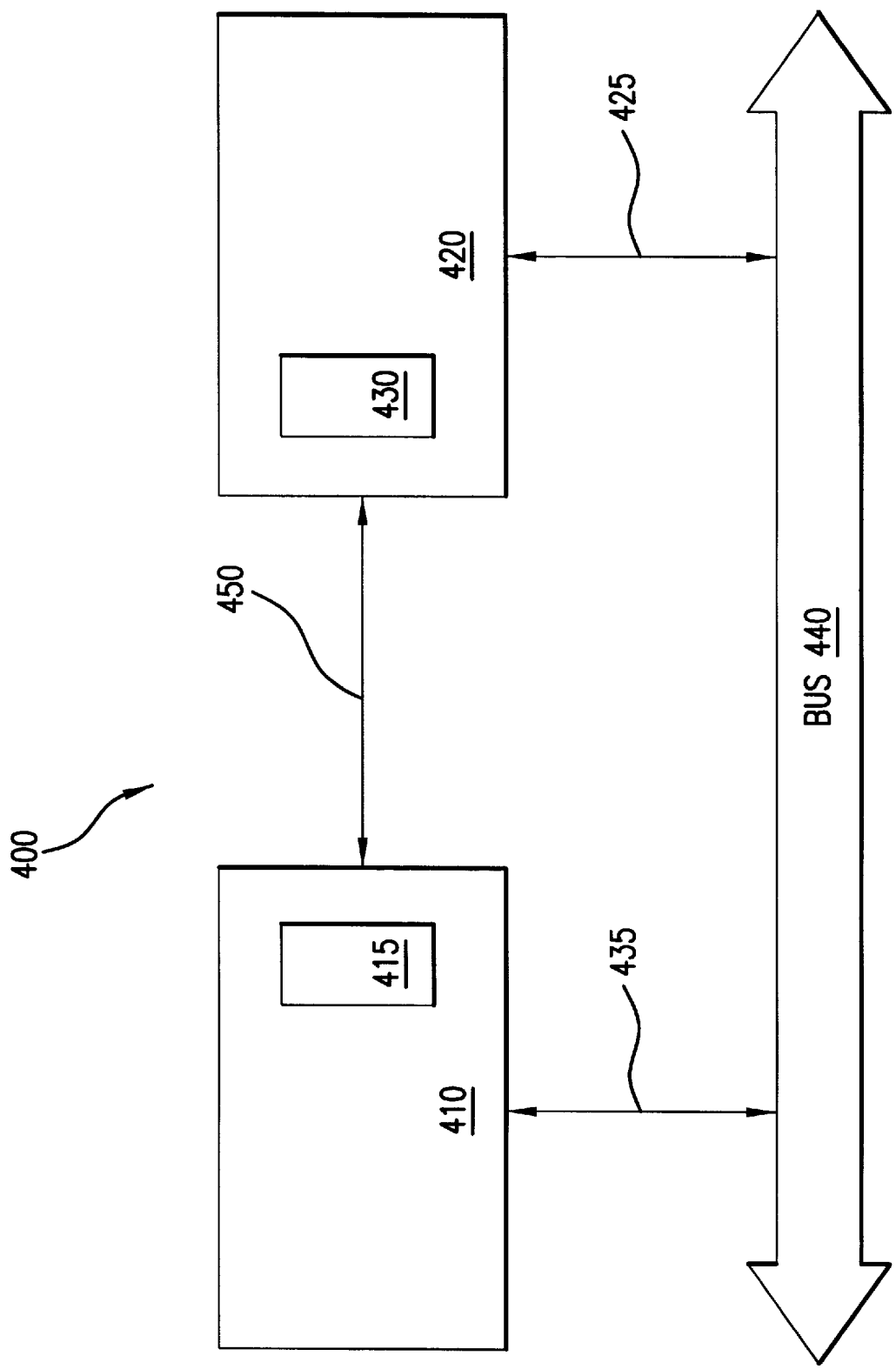
FIG. 7 shows another embodiment of the present invention in which a memory device with a temperature sensing circuit is coupled to a memory controller.

FIG. 7 shows one embodiment of a memory device with a temperature sensing circuit coupled to a memory controller. In particular, system 400 includes controller 410 coupled to bus 440 along line 435. Bus 440, in turn, is coupled to memory device 420 via line 425. For one embodiment, bus 440 transmits address and data between controller 410 and memory device 420. Accordingly, using bus 440, controller 410 reads/writes data directly from memory device 420.

As illustrated in FIG. 7, controller 410 includes register 415 and memory device 420 includes circuit 430. Circuit 430 is a temperature sensing circuit that is coupled to register 415 via line 450. Controller 410 uses circuit 430 to determine the operating temperature of memory device 420. In particular, if memory device 420 is operating above a threshold temperature, then circuit 430 generates a digital signal along line 450. For one embodiment, circuit 430 generates a logic "1" to indicate that memory device 420 is operating above a threshold temperature. The logic "1" signal sets a temperature flag in register 415. Based on the set temperature flag, controller 410 initiates a regulation scheme to throttle the operation of system 400, thus reducing the temperature of memory device 420.

Controller 410 periodically samples register 415 to determine whether the temperature flag is set. For one embodiment, the sampling period is derived from empirical data. In particular, the time period between memory device 420 reaching a threshold temperature and memory device 420 reaching $Tj_{,max}$ is empirically ascertained. The sampling period is set to a value that is less than the sum of the empirically derived time and the time required to initiate regulation. Setting the sampling period to such a value ensures that controller 410 initiates a regulation scheme prior to memory device 420 surpassing $Tj_{,max}$. For another embodiment, memory device 420 loads the sampling period of the memory device into controller 410 during the initialization of system 400.

For illustrative purposes, the previous description describes a digital signal generated by circuit 430 along line 450. For one embodiment, however, circuit 430 is a temperature sensitive diode that generates an analog signal. For an alternative embodiment, the output of circuit 430 is transmitted along bus 440.

Figure 8:
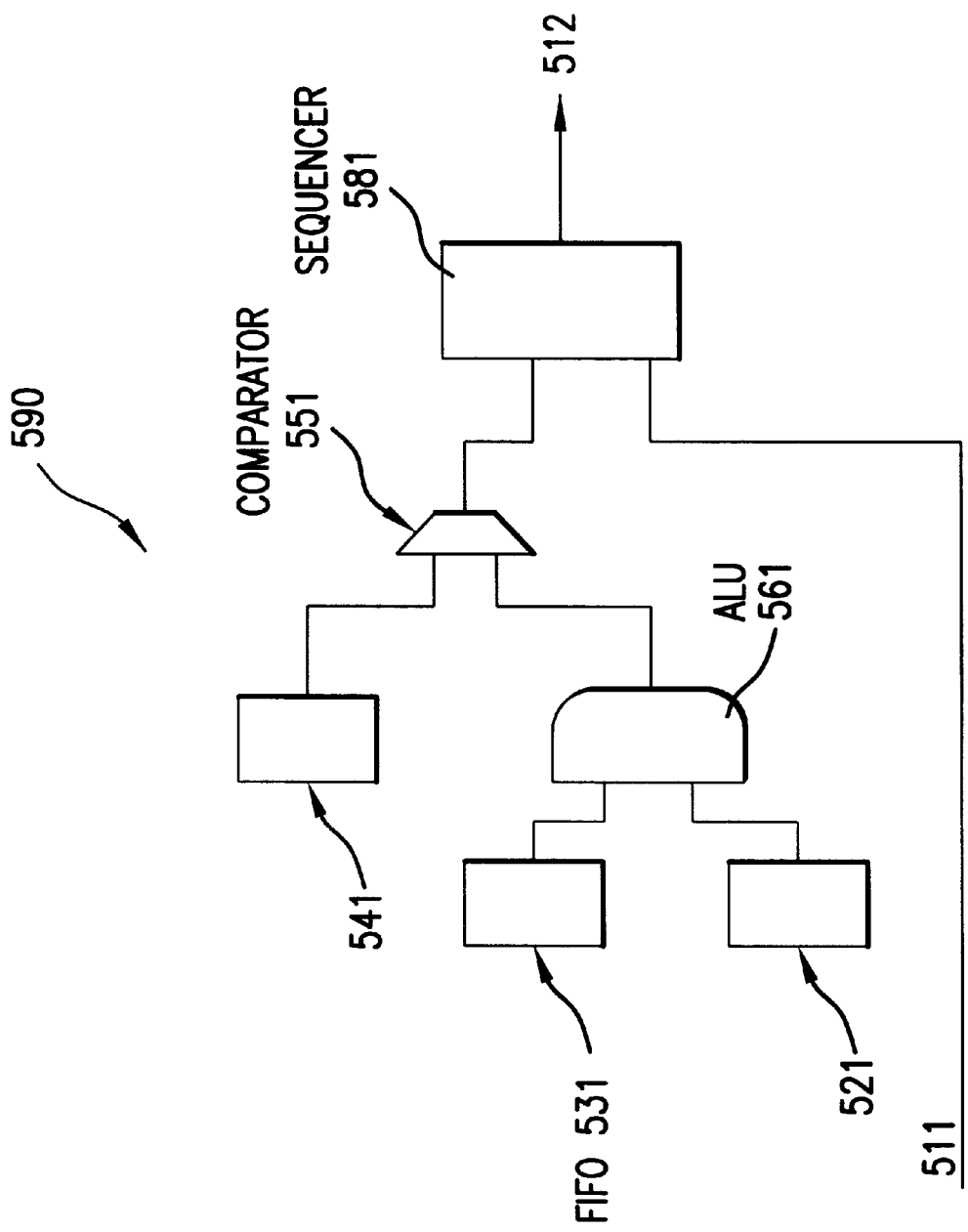
FIG. 8 shows an exemplary thermal regulation circuit consistent with one aspect of the present invention.

FIG. 8 shows one embodiment of a thermal regulation circuit included in circuit 215. In particular, circuit 590 includes input 511, output 512, register set 541, and sequencer 581. Circuit 590 also includes, FIFO 531 register set 521, comparator 551, and arithmetic logic unit ("ALU") 561. As illustrated in FIG. 8, sequencer 581 is coupled to input 511 and output 512. For one embodiment, during normal operation, instructions from controller 210 to memory device 220 are transmitted along input 511 through sequencer 581 and onto output 512. During thermal regulation, however, sequencer 581 modifies the instruction sequence transmitted to memory device 220. For example, for one embodiment, sequencer 581 can introduce delay during thermal regulation.

As further illustrated in FIG. 8, register set 521 and FIFO 531 are coupled to the inputs of ALU 561. The output of ALU 561 is coupled to the first input of comparator 551. The second input of comparator 551 is coupled to register set 541. The output of comparator 551 is coupled to sequencer 581.

For one embodiment, circuit 590 uses FIFO 531, register set 521, register set 541, comparator 551, and ALU 561 to determine whether the thermal regulation of memory device 220 is necessary. In particular, register set 521 includes power value data for memory device 220. As previously described, FIFO 531 includes counter information for the operations performed by memory device 220. Using the counter information of FIFO 531 and the power value data of register set 521, ALU 561 performs arithmetic calculations to estimate the operating temperature of memory device 220. After ALU 561 performs the temperature estimation, comparator 551 compares the estimated temperature versus the contents of register set 541. For one embodiment, register set 541 includes empirically derived threshold temperatures.

As explained above, the power value data stored in register set 521 may initially be stored in the memory controller, in one or more registers associated with the memory device(s), or in a memory module element, such as an SPD device.

If the comparison between the estimated temperature and the threshold temperatures shows that thermal regulation is necessary, sequencer 581 initiates a regulation scheme. For example, in one embodiment, the regulation scheme consists of increasing the refresh rate of memory device 220. In an alternative embodiment, regulating the operation of the memory system consists of dynamically changing the timing parameters of memory system 200. For another embodiment, regulating the operation of the memory system consists of dynamically placing memory device 220 in a low power mode. For yet another embodiment, regulating the operation of the memory system consists of dynamically enabling a cooling system. For another embodiment, regulating the operation of the memory system consist of introducing delays between operations.

Figure 9:
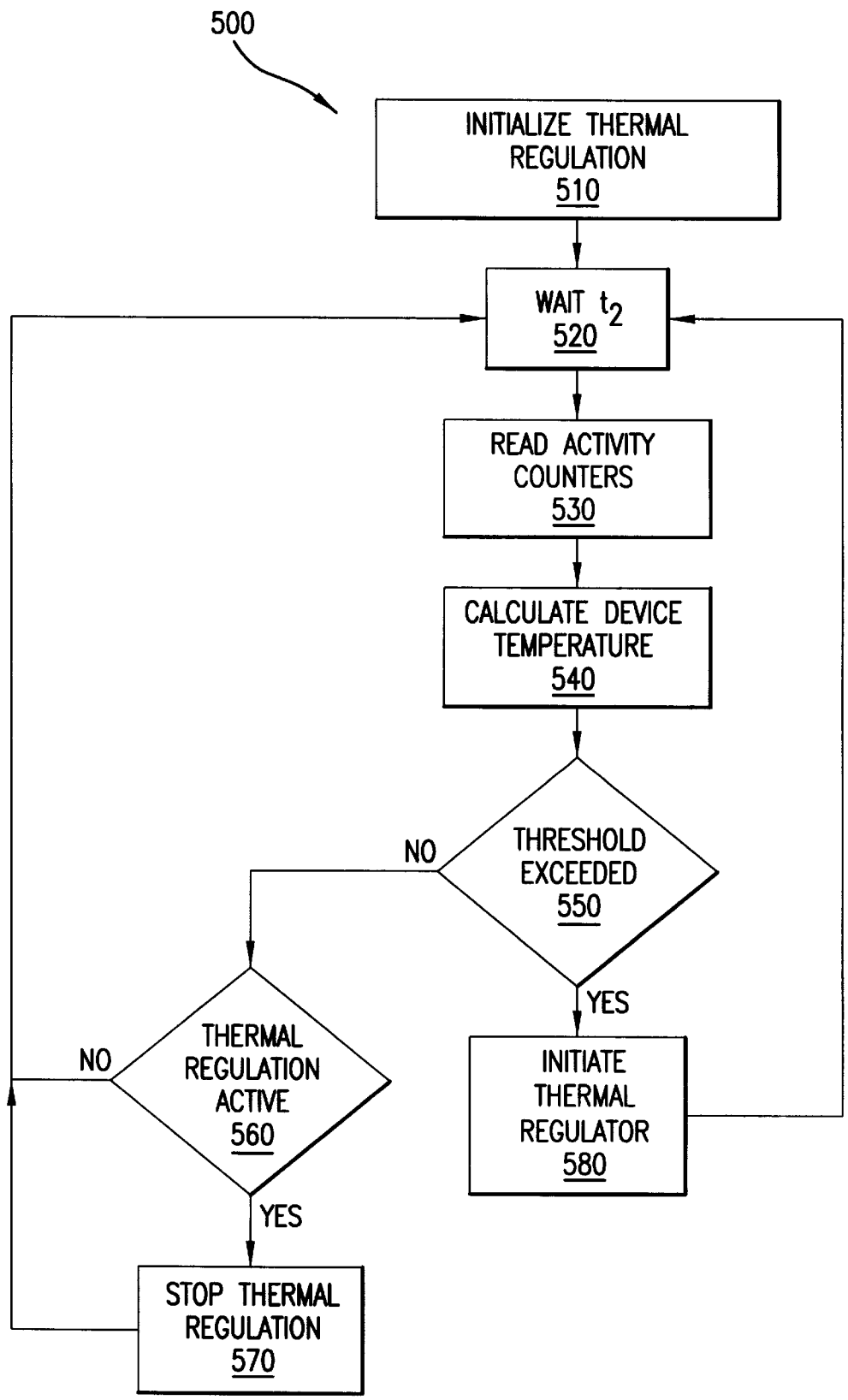
FIG. 9 is a high level flowchart illustrating a method of thermal regulation in a memory subsystem according to another embodiment of the present invention.

FIG. 9 shows one embodiment of a flowchart used by a thermal regulation circuit to implement a thermal regulation scheme. In particular, flowchart 500 shows the steps followed by circuit 590 during the thermal regulation of memory device 220. Using steps 510 through 580, circuit 590 ensures that memory device 220 does not exceed $Tj_{max}$. Step 510 is the initial step in flowchart 500.

For one embodiment, step 510 occurs after the power up of system 200. In step 510, circuit 590 initializes the thermal regulation scheme. In particular, in step 510, circuit 590 resets the counters of FIFO 531. Further, in step 510, circuit 590 reads the timing parameters and threshold values of memory device 220 into register set 521 and register set 521. After the initialization of the regulation scheme, step 520 is begun.

In step 520, circuit 590 waits a "t2" time period to read the counter values in FIFO 531. For one embodiment, "t2" equals the predetermined time period necessary to acquire data for one stage of FIFO buffer 260 included in circuit 216. For an alternative embodiment, "t2" is read by memory controller 510 during the initialization stage described in step 510. After circuit 590 waits "t2" seconds step 530 is begun.

In step 530, circuit 590 reads the counter information in FIFO 531. Subsequently, in step 540, the operating temperature of memory device 220 is calculated via ALU 561. As previously described, for one embodiment, the FIFO counter information is used to compute an estimate of the operating temperature of memory device 220. For an alternative embodiment, a memory device with a temperature sensing circuit is used in system 200 for example, memory device 420 and circuit 430 of system 400. In particular, if memory device 420 is operating above a threshold temperature, then the output of circuit 430 activates a temperature flag in sequencer 581. In step 540, the temperature flag is evaluated to determine the operating temperature of the memory device 220. After calculating/evaluating the operating temperature of the memory device 220, step 550 is begun.

In step 550, the ALU 561 estimated temperature of memory device 220 is compared against a threshold value. For one embodiment, provided the calculated temperature of memory device 220 exceeds the threshold value, flowchart 500 transitions to step 580. In step 580, a thermal regulation scheme is initiated. As previously described, the thermal regulation scheme reduces the operating temperature of memory device 220, or increases the refresh rate so that the memory device can operate at a temperature above Tj max. For an alternative embodiment, the calculated temperature of memory device 220 is compared against multiple thresholds. The multiple thresholds allow system 200 to initiate a different regulation scheme for each threshold. In particular, provided a first threshold is exceed, flowchart 500 transitions to step 580 to initiate a regulation scheme corresponding to the first threshold. If a second threshold is exceed, then flowchart 500 transitions to step 580 to initiate a second regulation scheme corresponding to the second threshold. Accordingly, the use of different regulation schemes allow system 200 to perform graduated steps to reduce the operating temperature of memory device 220. The graduated steps allow system 200 to balance temperature control versus system performance. After starting a thermal regulation scheme, flowchart 500 returns to step 520.

If the calculated temperature of memory device 220 does not exceed a threshold value, step 560 is begun. In step 560, circuit 590 determines whether a thermal regulation scheme is active. If all thermal regulation schemes are inactive, flowchart 500 transitions to step 520. If a thermal regulation scheme is active, then flowchart 500 transitions to step 570.

In step 570, for one embodiment, circuit 590 stops an active thermal regulation scheme. Circuit 590 stops the active thermal regulation scheme because the calculated temperature of memory device 220 does not exceed a threshold value. Accordingly, the operating temperature of memory device 220 is not approaching $Tj_{max}$ and the active regulation scheme is unnecessary. For an alternative embodiment, in step 570, if the regulation scheme involves multiple threshold values, one or more regulation mechanisms is deactivated depending on which threshold values are exceeded. After step 570, flowchart 500 returns to step 520.

Figure 10:
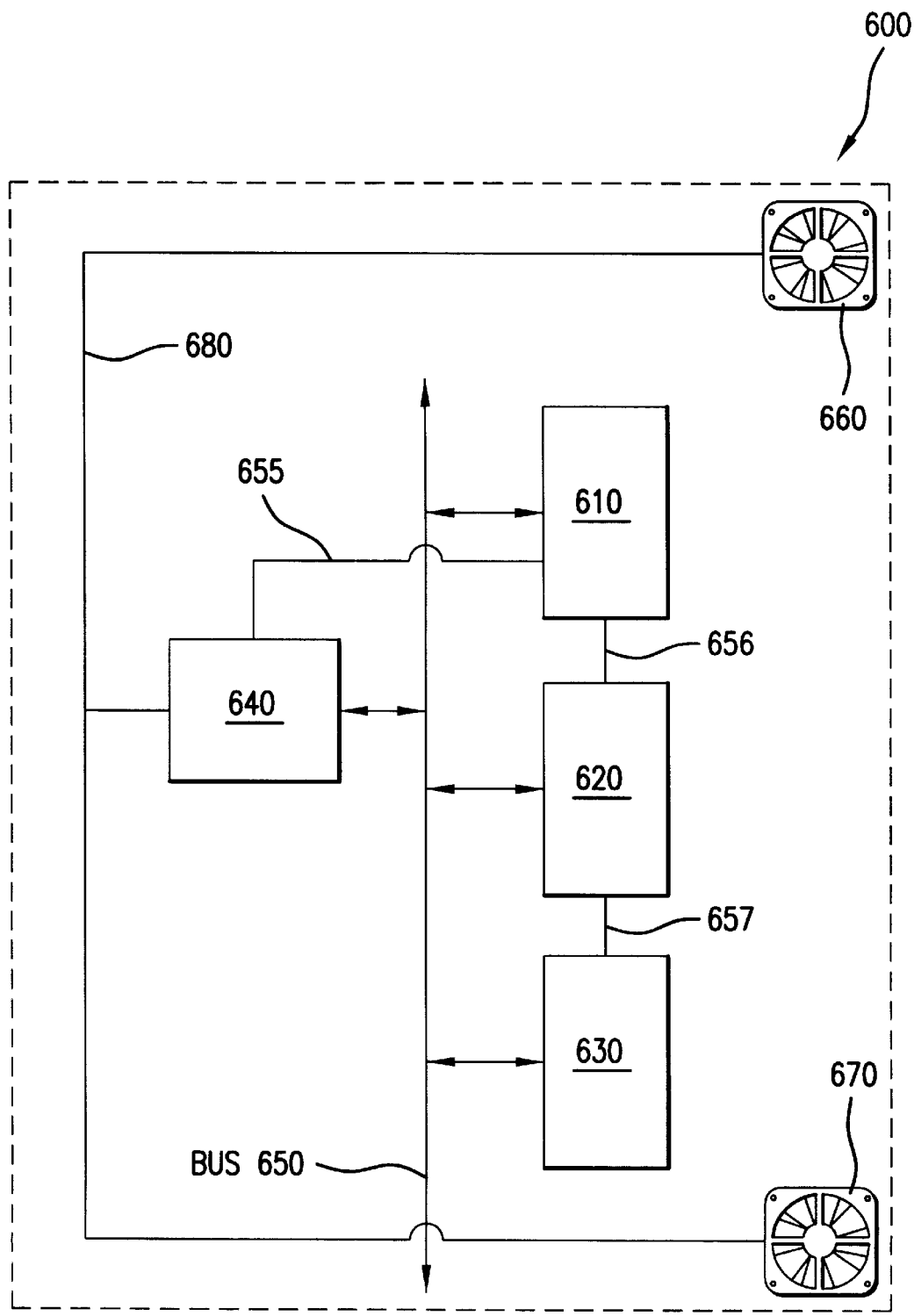
FIG. 10 shows yet another embodiment of the present invention in which a memory system incorporates thermal regulation circuitry; and, FIG. 11 shows a memory module adapted to the present invention.

FIG. 10 shows one embodiment of a memory system. In particular, system 600 includes controller 640 coupled to memory devices 610, 620, and 630 via bus 650. For one embodiment, bus 650 transmits address and data between controller 640 and memory device 610, 620, and 630. Accordingly, using bus 650 controller 640 reads/writes data directly from the memory devices.

Memory devices 610, 620, and 630 and controller 640 are also coupled to each other via signal lines 655–657. The signal lines form a chain between controller 640 and the memory devices. In particular, memory device 630 is coupled to memory device 620 via signal line 657. Similarly, memory device 620 is coupled to memory device 610 via signal line 656. Finally, memory device 610 is coupled to controller 640 via signal line 655. For one embodiment, during the initialization of system 600 signal lines 655–657 transfer the timing parameters and refresh rates of the memory devices to controller 640.

For one embodiment, controller 640 estimates the memory device operating temperature. As previously described, based on the estimated operating temperature controller 640 initiates a regulation scheme. The regulation scheme reduces the operating temperature of the memory device(s) operating above a threshold temperature. For an alternative embodiment, memory devices 610, 620, and 630 include temperature sensing circuits. Thus, controller 640 determines the actual operating temperature of each memory device. In particular, each temperature sensing circuit outputs a digital signal indicating whether the memory device corresponding to the sensing circuit is operating above a threshold temperature. For one embodiment, signal lines 655–657 transfer the digital signals to controller 640. Based on the digital signals, controller 640 initiates a regulation scheme to reduce the temperature of those memory devices operating above a threshold temperature. For an alternative embodiment, the digital signals are transferred to controller 640 via bus 650.

Controller 640 is also coupled to a cooling system (660 and 670) via line 680. For one embodiment, a regulation scheme implemented by controller 640 includes initiating a cooling system. Accordingly, controller 640 activates fan 660 and fan 670 when the controller determines that one of the memory devices 610, 620, or 630 is approaching $Tj_{max}$ As described above, the present invention contemplates thermal management on a memory module basis as well as memory device basis. To further illustrate this point, reference is made to FIG. 11 which illustrates a memory module and its relation to the present invention.

Figure 11:
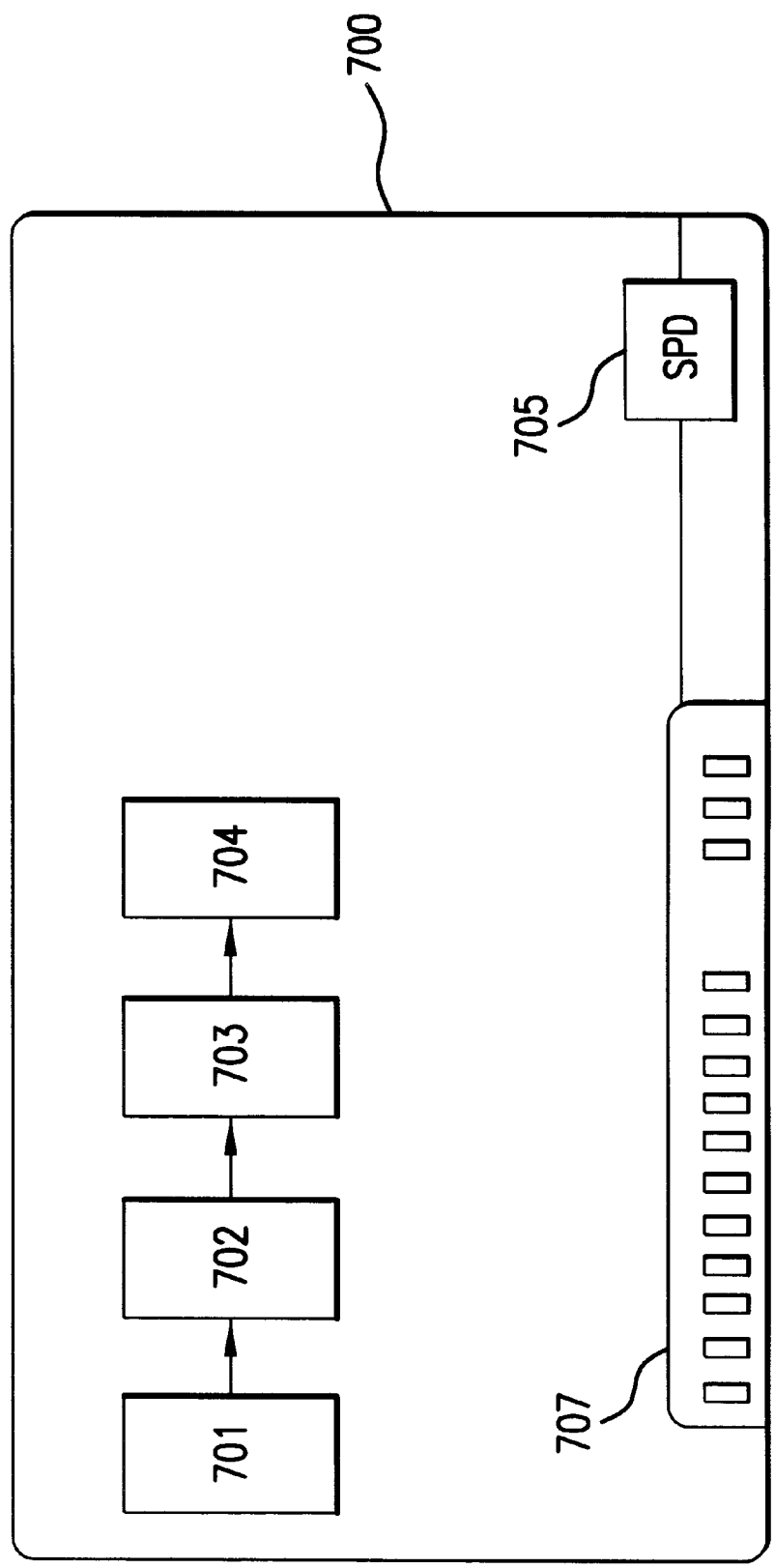

In general block diagram form, FIG. 11 illustrates a memory module 700 in card form having a series of plug-in connectors 707, a plurality of memory devices 701–704, and a serial presence detect (SPD device) 705. The plurality of memory devices are commonly connected to the bus, but SPD device 705 generally communicates with memory controller via a separate signal line. While the illustrated example contains an SPD device connected via a dedicated signal line, one of ordinary skill will appreciate that any type of data storage element associated with the memory module and communicating with the memory controller via any reasonable means may be used to store power value data associated with the memory devices. The SPD device is presently preferred because it is already routinely incorporated in memory modules, and interrogated by the memory controller during memory system initialization. Thus, the present invention make efficient use-of existing memory system resources to effect novel features and derive their additional benefit.

In the foregoing specification, the invention has been described with reference to specific exemplary embodiments. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A memory system comprising:
    a memory controller coupled to a bus;
    a memory module comprising N memory devices coupled to the bus, each one of the N memory devices operable to receive data from the bus during a write operation and to transmit data onto the bus during a read operation;
    wherein the memory controller comprises:
        a tracking circuit operable to track a number of memory device operations in M of the N memory devices during a period of time, where M is less than or equal to N; and
        a control circuit operable to manipulate operation of the memory system in response to a comparison of the number of memory operations and a reference.

2. The memory system of claim 1, wherein the tracking circuit comprises at least one counter.

3. The memory system of claim 2, wherein the at least one counter comprises:
    a first counter incremented by each read operation during the period of time; and
    a second counter incremented by each write operation during the period of time.

4. The memory system of claim 2, wherein the at least one counter comprises a First-In-First-Out (FIFO) buffer.

5. The memory system of claim 1, wherein the reference comprises power value data relating a number of memory device operations with an estimated operating temperature for the M memory devices.

6. The memory system of claim 5, wherein the power value data is stored in the memory controller.

7. The memory system of claim 5, wherein the power value data is stored in one or more registers on the N memory devices.

8. The memory system of claim 5, wherein the memory module further comprises a data storage element storing the power value data for the M memory devices.

9. The memory system of claim 1, wherein the memory controller further comprises:
    a delay circuit operable to select a first delay between successive read operations to the M memory devices and to select a second delay between successive write operations to the M memory devices on the basis of a control circuit comparison indicating that the number of memory operations exceeds the reference.

10. The memory system of claim 5, wherein each of the N memory devices is operable in first and second modes of operation, wherein each of the N memory devices consumes less power in the second mode of operation as compared with the first mode of operation; and
    wherein the memory controller is operable to select between the first and second modes of operation for each one of the M memory devices on the basis of the control circuit comparison.

11. A method of regulating the operating temperature of memory devices in a memory system comprising; a memory controller and a memory module comprising a plurality of memory devices, the method comprising:
    determining a number of operations involving one or more memory devices on the memory module during a time period;
    comparing the number of operations to reference data corresponding to an estimated operating temperature the one or more memory devices;
    determining whether to manipulate the operation of the memory system on the basis of the comparison between the number of operations and the reference data.

12. The method of claim 11, wherein the number of operations comprises at least one of a number of read operations involving the one or more memory devices, a number of write operations involving the one or more memory devices, and a number of refresh operations involving the one or more memory devices.

13. The method of claim 11, further comprising:
    upon determining to manipulate the operation of the memory system, introducing delays between successive read operations and successive write operations to the one or memory devices.

14. The method of claim 11, further comprising:
    upon determining to manipulate the operation of the memory system, placing the one or more memory devices in a mode of operation requiring less power.

15. The method of claim 11, further comprising:
upon determining to manipulate the operation of the memory system, increasing the refresh rate for the one or more memory device.

16. A memory system comprising:
a memory module comprising N memory devices coupled to a bus, each one of the N memory devices being operable in at least a first power mode and a second power mode, and having a maximum threshold temperature;
at least one temperature sensors measuring actual operating temperature for a group M of the N memory devices, where M is less than or equal to N;
a memory controller coupled to the bus, the memory controller selecting the first power mode for each memory device in the group M having an actual operating temperature below the maximum threshold temperature, and selecting the second power mode for each memory device in the group M having an actual operating temperature above the maximum threshold temperature;
wherein each one of the N memory device consumes less power in the second power mode than in the first power mode.

17. The memory system of claim 16, wherein the at least one temperature sensor generates temperature data communicated to the memory controller via the bus.

18. The memory system of claim 16, wherein the at least one temperature sensor generates temperature data, and wherein the memory system further comprises a signal line outside the bus connecting the at least one temperature sensor and the memory controller, such that the temperature data is communicated to the memory controller via the signal line.

19. The memory system of claim 18, wherein the temperature data comprises a digital flag and wherein the memory controller further comprises a data register connected to the signal line and storing a value associated with the digital flag.

20. A method of regulating the operating temperature of memory devices in a memory system comprising a memory controller and a memory module comprising N memory devices, the method comprising:
storing power value data indicative of a maximum threshold temperature for at least one of the N memory devices in a data storage element associated with the memory module;
tracking a number of memory system operations involving M of the N memory devices during a time period, where M is less than or equal to N and where the number of operations is indicative of an estimated operating temperature for the M memory devices;
comparing the number of memory system operations to the power value data; and
upon determining based on the comparison of the number of memory system operations to the power value data that the estimated operating temperature for the M memory devices is greater than the maximum threshold temperature, manipulating the operation of the memory system to reduce the operating temperature of the M memory devices.

21. The method of claim 20, further comprising:
reading the power value data from the data storage element during memory system initialization.

22. The method of claim 20, wherein the data storage element is a serial presence detect device.

23. A memory system controller operating in a memory system, the memory system comprising one or more memory devices coupled to the memory system controller via a bus, and memory system controller comprising:
a first circuit adapted to count a number of memory system operations; and
a second circuit adapted to modify an operating parameter of the memory system in relation to a comparison of the number of memory system operations counted by the first circuit and power value data, wherein the operating parameter comprises at lease one selected from a group consisting of: memory device refresh rate, memory device power mode, or memory system timing parameter.

24. The memory system controller of claim 23, further comprising a third circuit storing the power value data.

25. The memory system controller of claim 24, wherein the third circuit receives the power value data from at least one of the one or more memory devices via the bus.

26. The memory system controller of claim 25, wherein the one or more memory devices are configured on a memory module comprising a serial-presence-detect (SPD) device storing the power value data.

27. The memory system controller of claim 24, wherein the second circuit further comprises:
an arithmetic logic unit (ALU) estimating a memory device temperature value on the basis of the power value data stored in the third circuit and the number of a counted number of memory system operations derived from the first circuit;
a fourth circuit storing temperature threshold data related to the one or more memory devices; and,
a comparator circuit comparing the memory device temperature value with the temperature threshold data and generating a control signal used to modify an operating parameter of the memory system.

28. The memory system controller of claim 27, further comprising:
a sequencer circuit receiving a series of memory system instructions and outputting the series of memory system instructions in accordance with the control signal generated by the comparator circuit.

29. The memory system controller of claim 23, wherein the first circuit comprises a plurality of counters, each counter in the plurality of counters being adapted to count a different type of memory system operation.

30. The memory system controller of claim 29, wherein each counter in the plurality of counters comprises a first-in-first-out (FIFO) buffer circuit.

* * * * *